(12) United States Patent
Krishnamurthy et al.

(10) Patent No.: US 10,298,117 B2
(45) Date of Patent: May 21, 2019

(54) MASTER-SLAVE CONTROLLER ARCHITECTURE

(71) Applicant: INTEL CORPORATION, Santa Clara, CA (US)

(72) Inventors: Harish Krishnamurthy, Hillsboro, OR (US); Khondker Ahmed, Hillsboro, OR (US); Vivek De, Beaverton, OR (US); Nachiket Desai, Portland, OR (US); Suhwan Kim, Hillsboro, OR (US); Xiaosen Liu, Portland, OR (US); Turbo Majumder, Portland, OR (US); Krishnan Ravichandran, Saratoga, CA (US); Christopher Schaef, Lebanon, NH (US); Vaibhav Vaidya, Portland, OR (US); Sriram Vangal, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/638,643

(22) Filed: Jun. 30, 2017

(65) Prior Publication Data
US 2019/0006939 A1    Jan. 3, 2019

(51) Int. Cl.
*H04W 84/20* (2009.01)
*H02M 1/42* (2007.01)
(Continued)

(52) U.S. Cl.
CPC ......... *H02M 1/4233* (2013.01); *H04W 84/20* (2013.01); *H02M 1/084* (2013.01);
(Continued)

(58) Field of Classification Search
CPC . H02M 2003/1566; H02M 2003/1557; H02M 3/156; H02M 3/158; H02M 3/1588;
(Continued)

(56) References Cited

U.S. PATENT DOCUMENTS 5,796,961 A    8/1998   O'Brien
6,268,716 B1   7/2001   Burstein et al.
(Continued)

OTHER PUBLICATIONS

Pan, et al., "A Precisely-Regulated Multiple Output Forward Converter with Automatic Master-Slave Control", IEEE 36th Power Electronics Specialists Conference, 2005, pp. 969-975.
PCT/US2018/031392, International Search Report and Written Opinion, dated Aug. 17, 2018, 15 pages.

*Primary Examiner* — Bryan R Perez
(74) *Attorney, Agent, or Firm* — Stoel Rives LLP

(57) ABSTRACT

Embodiments described herein describe operating a master-slave controller. Operating the master-slave controller comprises, based on a determination that the first output voltage value is greater than the second output voltage value, calculating a first duty cycle value and an input voltage value and the second voltage regulator, calculating a second duty cycle value based on the first duty cycle value, and based on a determination that the second output voltage value is greater than or equal to the first output voltage value, calculating the second duty cycle value based on the second output voltage value and the input voltage value and calculating the first duty cycle value based on the second duty cycle value and configuring the first voltage regulator with the first duty cycle value and the second voltage regulator with the second duty cycle value.

20 Claims, 9 Drawing Sheets

(51) Int. Cl.
  *H03M 1/00* (2006.01)
  *H02M 1/00* (2006.01)
  *H02M 1/084* (2006.01)
  *H02M 3/158* (2006.01)

(52) U.S. Cl.
  CPC .......... *H02M 3/158* (2013.01); *H02M 3/1584* (2013.01); *H02M 2001/0006* (2013.01); *H03M 1/00* (2013.01)

(58) Field of Classification Search
  CPC .... H02M 3/155; H02M 3/1582; H02M 3/157; H02M 3/1563; H02M 2001/0012; H02M 2001/0009; H02M 1/4233; H02M 3/1584; H02M 2001/0006; H02M 1/084; H04W 84/20; H03M 1/00
  See application file for complete search history.

(56) References Cited

U.S. PATENT DOCUMENTS

| | | | | |
|---|---|---|---|---|
| 2006/0164050 | A1* | 7/2006 | Hasegawa | H02M 3/1584 323/272 |
| 2007/0076453 | A1 | 4/2007 | Schultz et al. | |
| 2011/0241636 | A1* | 10/2011 | Wu | H02M 3/1584 323/272 |
| 2013/0057242 | A1* | 3/2013 | Zambetti | H02M 3/1584 323/282 |
| 2015/0028825 | A1* | 1/2015 | Mao | H02M 3/157 323/234 |
| 2017/0163085 | A1 | 6/2017 | Vogman et al. | |

\* cited by examiner

MASTER-SLAVE CONTROLLER ARCHITECTURE

TECHNICAL FIELD

The present disclosure relates to master-slave controller architecture for a voltage regulator.

DETAILED DESCRIPTION OF PREFERRED EMBODIMENTS

Figure 1:
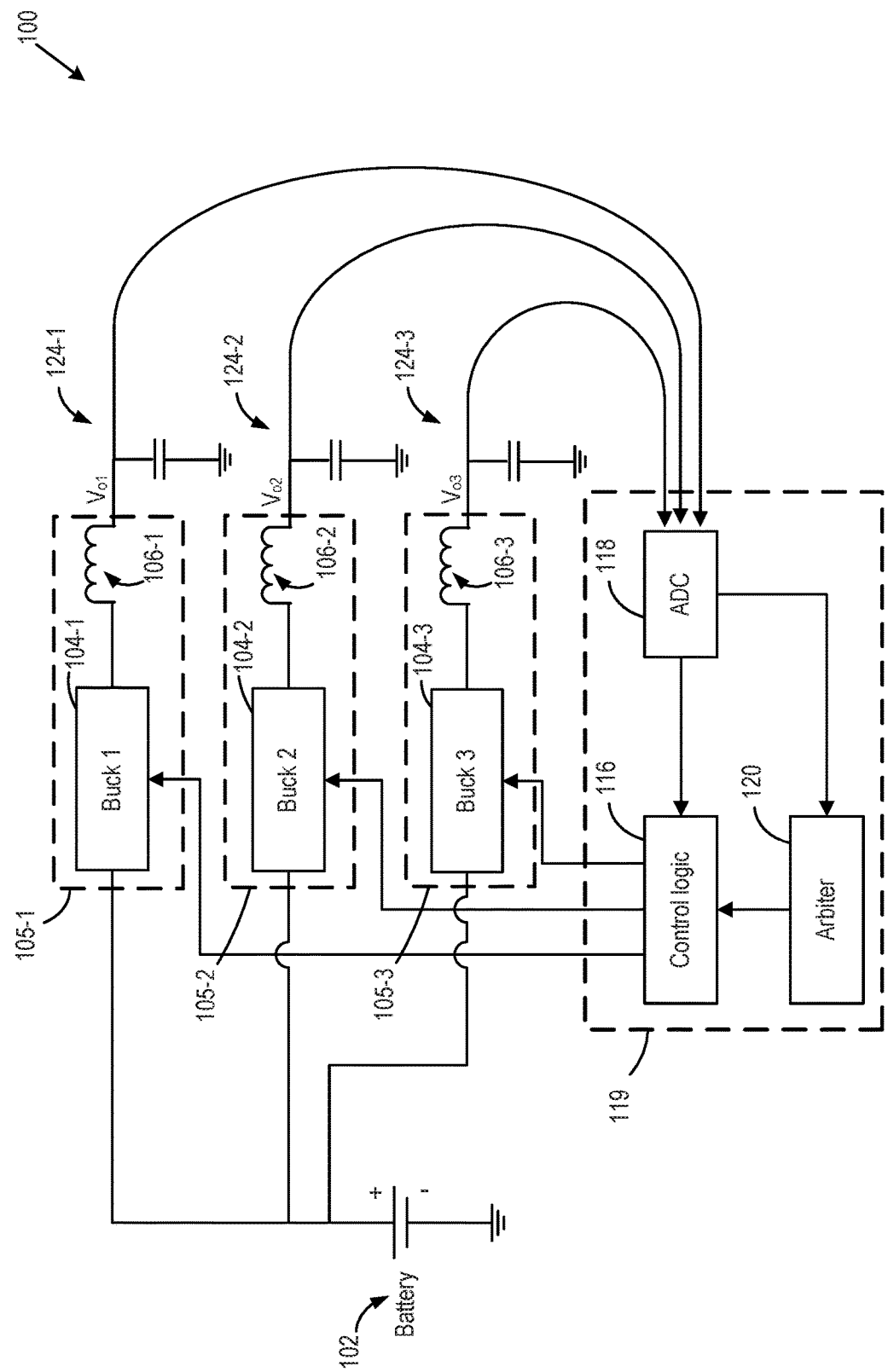
FIG. 1 is a block diagram illustrating a power system according to various embodiments.

Apparatuses, methods, and a storage medium associated with a master-slave controller for one or more voltage regulators are disclosed herein. A number of embodiments are also associated with controlling a plurality of voltage regulators utilizing a single master-slave controller.

A net zero energy system (e.g., computing device) may comprise compute elements, communication elements, sensors, actuators, energy harvesters, and/or a battery to balance harvested power and load draw. If such a system is capable of edge node processing, then the load dynamic range of such a system could be very large (10000×). To tackle the disparity in the output voltages multiple converters are used.

For example, the computing device can comprise a compute rail, a communications rail, and a sensors rail. The compute rail provides a first voltage to one or more compute elements. The communications rail provides a second voltage to the communication elements. The sensor rail provides a third voltage to one or more sensors. The workloads are such that only one system is active. That is, one of the rails supports a larger draw of the power source while the other rails maintain a voltage or shut off.

A number of embodiments present a master-slave controller for a computing device to facilitate a single controller (e.g., a digital controller) for multiple voltage regulators. Utilizing a single controller to configure one or more voltage regulators can minimize the controller area and power overheads of a computing device. The regulator can be, for example, a single inductor multiple output (SIMO) regulator that minimizes the number of passive components while meeting the required performance metrics. As used herein, the term regulator encompasses converters.

A number of embodiments describe a master-slave controller where a single controller is used to control the voltages applied to multiple rails. A controller or voltage regulator and/or a portion of the controller or voltage regulator that operates using the duty cycle used for the maximum current draw rail is labeled a master controller or a master voltage regulator. The other controllers or voltage regulators are labeled slave controllers or voltage regulators and are configured with a duty cycle that is a value proportional to the output voltages of the other controllers with regards to the master output voltage from the derived duty cycle of the master controller or voltage regulator. Utilizing a single controller to control multiple voltage regulators saves significant power overheads for the power rails with little or no current draw.

As previously mentioned, a number of embodiments reduce the control overheads of voltage regulators (e.g., power converters) from N to 1. In previous embodiments, each voltage regulator can be associated with a different controller. A number of embodiments reduce the different controllers to a single controller to provide power savings. The power savings include the power used by the different controllers as compared to a single controller. The power savings can also include the reduced current draw of the different controllers. The embodiments described herein are also applicable to a number of regulator topologies including a boost power stage, a buck power stage, or a buck-boost power stage of one or more voltage regulators.

FIG. 1 is a block diagram illustrating a power system 100 according to various embodiments. The power system 100 includes a battery 102, buck power stages 104-1, 104-2, and 104-3 (referred to generally as power stages 104), inductors 106-1, 106-2, and 106-3, and rails 124-1, 124-2, and 124-3. The power system 100 also comprises control logic 116, an analog-to-digital converter (ADC) 118, and an arbiter 120.

While the power system 100 shows a battery 102, any type of power source can be used in conjunction with the embodiments described herein. In some examples, a voltage regulator comprises an inductor and a power stage. For example, a voltage regulator 105-1 comprises the buck power stage 104-1 and the inductor 106-1. A voltage regulator 105-2 comprises the buck power stage 104-2 and the inductor 106-2. A voltage regulator 105-3 comprises the buck power stage 104-3 and the inductor 106-3. Each of the power stages comprises a plurality of switches. Although three voltage regulators are shown in FIG. 1, the embodiments described herein can include a greater number of voltage regulators or a smaller number of voltage regulators than those shown herein. The voltage regulators 105-1, 105-2, and 105-3 are referred to as voltage regulators 105.

In the example provided in FIG. 1, a master-slave controller 119 comprises the control logic 116, the ADC 118, and the arbiter 120. In other examples, the control logic 116 is considered a master-slave controller and the ADC 118 and/or the arbiter 120 can be external to the master-slave controller.

The rails 124-1, 124-2, and 124-3, referred to generally as rails 124, draw a voltage from the inductor based on the enablement of a plurality of gates in accordance with a duty cycle of the power stages 104. For example, the rail 124-1 draws 1.8 volts to service a plurality of sensors. The rail 124-2 draws 1.0 volts to service the communication components. The rail 124-3 draws 0.5 volts to service compute components.

The battery 102 (e.g., power source) provides an input voltage to each of the voltage regulators. Each of the voltage regulators receives the voltage at a corresponding power state (e.g., the power stages 104) and, utilizing the inductor and a plurality of gates, generates an output voltage that is provided to the rails 124.

At any given workload only one of the loads has a current draw equal to the draw requirement of the load. For example, a sensor coupled to the rail 124-1 can be powered to generate raw data from the sensor. The main current draw from the rail 124-1 is 1.8 volts. The control logic 116 corresponding to the master-slave controller generates the duty cycle corresponding to the 1.8 volts provided to the 124-1 rail.

In this example, the voltage regulator 105-1 is a master voltage regulator because at a given time the voltage regulator 105-1 provides a voltage that droops to a greater degree than the other voltage regulators 105-2 and 105-3. In some examples, at a different time period, the other voltage regulators 105-2 and 105-3 can provide a voltage that droops to a greater degree than that provided by the voltage regulator 105-1. In this case, one of the other voltage regulators 105-2 and 105-3 is labeled a master voltage regulator and the voltage regulator 105-1 is labeled a slave voltage regulator.

The control logic 116 provides a scaled value of the 1.0 volts and the 0.5 volts to the rails 124-2 and 124-3, respectively. The scaled value is a proportion of the output voltages of the voltage regulators 105-2 and 105-3 comprising the slave voltage regulators.

The duty cycle for the master voltage regulator can be determined by dividing the output voltage of the voltage regulator 105-1 by the input voltage provided by the battery 102. As such, the duty cycle for the master voltage regulator is equal to 1.8 volts divided by 3.6 volts which is equal to a 50% duty cycle, where the input voltage is equal to 3.6 volts (e.g., voltage provided by the battery 102).

The duty cycle for the slave voltage regulators can be determined by multiplying the duty cycle of the master voltage regulator by the output voltage of the corresponding slave voltage regulator and dividing the result by the output voltage of the master voltage regulator. For example, the duty cycle for the voltage regulator 105-2 is equal to the duty cycle (e.g., 0.5) of the master voltage regulator multiplied by the output voltage (e.g., 1.0 volts) of the voltage regulator 105-2 and divided by the output voltage (1.8 volts) of the voltage regulator 105-1. That is, the duty cycle for the voltage regulator 105-2 is equal to 0.5*1.0 volts/1.8=0.28. The duty cycle for the voltage regulator 105-3 is equal to 0.5*0.5 volts/1.8 volts=0.138.

As mentioned, a label of a master voltage regulator is assigned dynamically to one of the voltage regulators 105. Defining the master voltage regulator dynamically maximizes the overall performance of the system while saving power.

Although FIG. 1 shows a buck power stage 104 and as a result a buck voltage regulator 105, the embodiments described herein can be applied to boost power stages/boost voltage regulators and buck-boost power stages/buck-boost voltage regulators. The embodiments described herein can also be applied to different voltage regulator topologies.

A time multiplexed ADC 118 samples all the output voltages at a required rate of sampling. That is, the ADC 118 samples the output voltages from the voltage regulators 105. The ADC 118 can be referenced as measuring circuitry. The ADC 118 receives a voltage in analog form and generates a digital value representing the voltage (e.g., output voltage value). In some examples, a different measuring circuitry can be used instead of the output voltages.

The arbiter 120 evaluates the output voltage values provided by the ADC 118. The arbiter 120 then decides which rail is drooping the maximum and assigns that particular rail to be the master and the other two rails to be the slaves. For example, the arbiter 120 decides which rail is drawing the greatest current/voltage and labels a corresponding voltage regulator providing the current/voltage as a master voltage regulator. A rail may droop when a corresponding inductor is not able to provide the requested voltage/current. As such, a droop describes a droop in voltage and may be referenced as voltage droop. The inductor may not be able to provide the requested voltage/current based on the duty cycle on which the corresponding voltage regulator is functioning. By increasing the duty cycle of a corresponding voltage regulator, the inductor provides the requested voltage/current to the rail. As such, a determination of which voltage regulator should be labeled a master voltage regulator can include identifying a voltage regulator that is generating an output voltage that is drooping more than the output voltages of the other voltage regulators.

A voltage can be considered to droop based on a history of the output voltage. For example, a second output voltage of a voltage regulator can be compared to a first output voltage of the voltage regulator to determine whether the second output voltage droops as compared to the first output voltage, the first output voltage being measured at a previous time than the measurement of the second output voltage.

The master-slave controller 119 and/or the control logic 116 can comprise a unique state machine of starting from a known value and clearing internal states of the classic Type-Ill controller. Once the voltage regulator 105 is labeled as the master voltage regulator, the master voltage regulator is configured with a known duty cycle and generates the corresponding pulse-width modulation (PWM) for a corresponding rail.

The other voltage regulators 105-2 and 105-3 then scale the generated duty cycle and use the scaled duty cycle for their own PWM generation. When the arbiter 120 decides that another voltage regulator is to be labeled a master voltage regulator based on a corresponding output voltage, the master-slave controller 119 clears the error states and loads the duty cycle states with the previously known value of the new master voltage regulator and continues to operate continuously.

The master-slave controller 119 can be a closed loop controller. The closed loop controller comprises an infinite impulse response (IIR) filter (not shown) with multiple states. The master-slave controller 119 through the control logic 116 can determine a current duty cycle based on the last three duty cycles. That is, the master-slave controller 119 and/or the control logic 116 comprises memory to store at least a first plurality of past duty cycles used to configure a master voltage regulator, a second plurality of past duty cycles used to configure a first slave voltage regulators, and a second plurality of past duty cycles used to configure a second slave voltage regualtor. For example, the master-slave controller 119 and/or the control logic 116 stores three past duty cycles and uses the three past duty cycles to calculate a current duty cycle for a master voltage regulator.

Each of the previous duty cycles used to calculate a current duty cycles can constitute a state of the master-slave controller 119 and/or the control logic 116. An error state can be defined as inaccurately correlating previous duty cycles with a master voltage. For example, if a first duty cycle, a second duty cycle, and a third duty cycle are previous duty cycles for the voltage regulator 105-1 which is a current master voltage regulator, then the first duty cycle, the second duty cycle, and the third duty cycle can comprise one or more error states when the voltage regulator 105-2 or the voltage regulator 105-3 are classified as a master voltage regulator. The filter of the master-slave controller 119 and/or the control logic 116 overwrites the previous duty cycles.

Not overwriting the previous duty cycles contributes to incorrectly calculating an current duty cycle when a new master voltage regulator is classified. If the previous duty cycles are not overwritten, then an incorrect current duty cycle is calculated until the previous duty cycles are flushed out.

Figure 2:
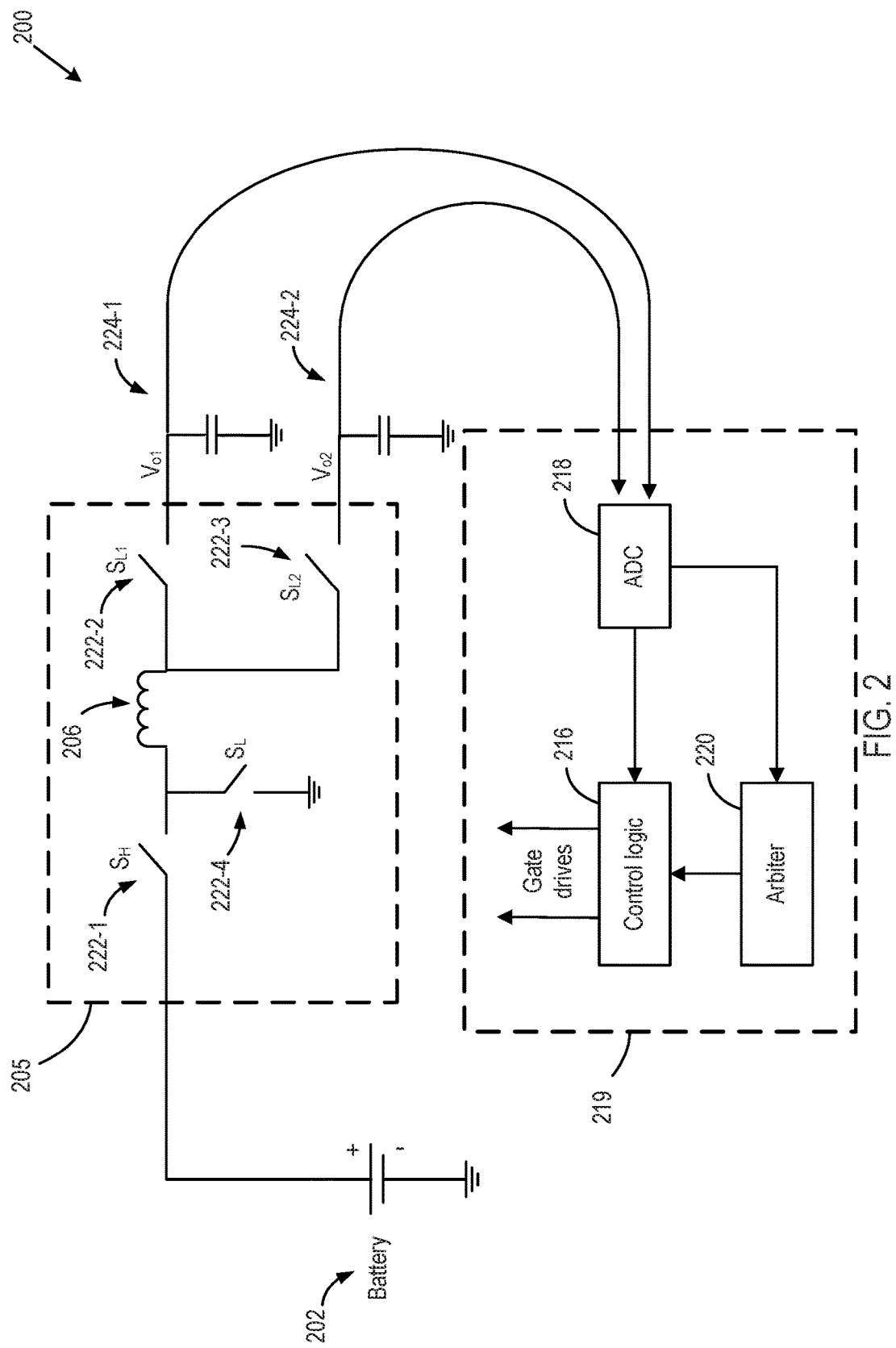
FIG. 2 is a block diagram illustrating a power system comprising a single input multiple output (SIMO) converter according to various embodiments.

FIG. 2 is a block diagram illustrating a power system 200 comprising a SIMO converter according to various embodiments. The power system 200 comprises a battery 202, a voltage regulator 205, a master-slave controller 219, and rails 224-1 and 224-2.

The voltage regulator 205 is a SIMO converter. The voltage regulator 205 comprises a plurality of gates 222-1, 222-2, 222-3, and 222-4, and a single inductor 206. The voltage regulator 205 receives an input voltage from the battery 202 and converts the input voltage to a first output voltage and a second output voltage. The first output voltage is provided to the rail 224-1 while the second output voltage is provided to the rail 224-2.

The master-slave controller 219 includes control logic 216, an ADC 218, and an arbiter 220. The master-slave controller 219 can include more or less components that those shown in FIG. 2.

The SIMO converters can operate in a discontinuous conduction mode (DCM). The SIMO converter can also employ several DCM controller schemes to regulate the multiple output voltages. However, the master-slave controller 219 can control the voltage regulator 205 in continuous conduction mode (CCM) which lowers a peak current and improves efficiency of the voltage regulator 205 as compared to the DCM approaches.

The master-slave controller 219 measures the first output voltage and the second output voltage utilizing the ADC 218. The ADC 218 provides a first output voltage value corresponding to the first output voltage and a second output voltage value corresponding to the second output voltage to the control logic 216 and the arbiter 220.

The arbiter 220 processes the first output voltage value and the second output voltage value to determine which of the voltages is drooping in comparison to corresponding voltages at an earlier time period. The arbiter 220 can also process the first output voltage value and the second output voltage value to determine which of the voltages has a greatest voltage droop. Based on the determination, the arbiter 220 assigns a master voltage regulator label to a corresponding group of the gates 222-1, 222-2, 222-3, and 222-4, referred to generally as the gates 222.

The gates 222 can be divided into two groups. The first group comprises the gates 222-1, 222-2, and 222-4. The second group comprises the gates 222-1, 222-3, and 222-4.

If a first group of the gates 222 generates a first output voltage in the rail 224-1 and a second group of the gates 222 generates a second output voltage in the rail 224-2, then the arbiter 220 assigns the first group of the gates 222 a label of master voltage regulator in response to determining that a voltage droop of the first output voltage is greater than a voltage droop of the second output voltage. The arbiter 220 can also assign the second group of the gates 222 a label of the master voltage regulator in response to determining that a voltage droop of the second output voltage is greater than a voltage droop of the first output voltage. The group of the gates 222 that is not labeled a master voltage regulator is labeled a slave voltage regulator.

Based on labeling of the different groups of gates 222 as a master voltage regulator or a slave voltage regulator, the control logic 216 determines a first duty cycle and a second duty cycle. For example, the first duty cycle value can be calculated based on the first output voltage value and an input voltage value corresponding to the input voltage if the first group of the gates 222 is labeled as a master voltage regulator. The second duty cycle value can be calculated based on at least the first duty cycle value.

If the second group of the gates 222 is labeled as a master voltage regulator, then the second duty cycle value can be calculated based on the second output voltage value and an input voltage value corresponding to the input voltage. The first duty cycle value can be calculated based on at least the second duty cycle value.

If the first group of gates are labeled a master voltage regulator, then the first duty cycle is equal to the first output voltage divided by the input voltage. The second duty cycle is equal to the first duty cycle multiplied by the second output voltage and divided by the input voltage. If the second group of gates are labeled a master voltage regulator, then the second duty cycle is equal to the second output voltage divided by the input voltage. The first duty cycle is equal to the second duty cycle multiplied by the first output voltage and divided by the input voltage. Although the first group of the gates 222 and the second group of the gates 222 share gates in the example of FIG. 2, in some examples, the first group of the gates and the second group of the gates are mutually exclusive groups of gates.

The control logic 216 also configures the gates 222 based on the first duty cycle value and the second duty cycle value. The control logic 216 configures the first group of gates 222 with the first duty cycle and the second group of the gates with the second duty cycle.

Figure 3:
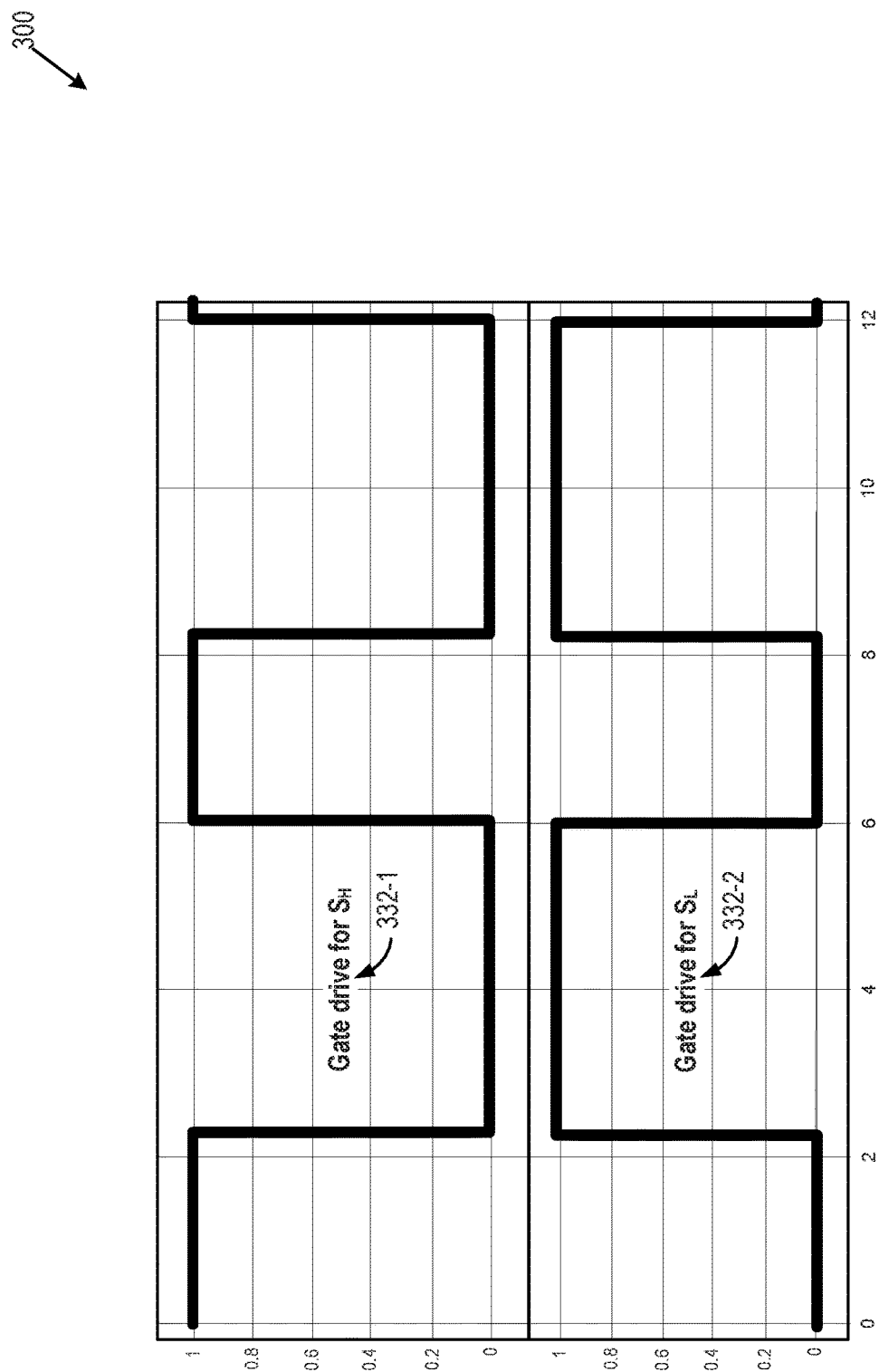
FIG. 3 is a graph illustrating gate drive signals according to various embodiments.

FIG. 3 is a graph 300 illustrating gate drive signals according to various embodiments. The graph 300 includes a gate drive signal 332-1 for SH and a gate drive signal 332-2 for SL. For example, the graph 300 is provided in terms of an x-axis representing time and a y-axis representing voltage.

The graph 300 shows the gate drive signal 332-1 and the gate drive signal 332-2 for the gate 222-1 (e.g., SH) and the gate 222-4 of FIG. 2, respectively. The gates 222-1 and 222-4 are turned on and off alternatively over time. For example, the gate 222-1 is turned on as shown in gate drive signal 332-1 while the gate 222-4 is turned off as shown in the gate drive signal 332-2. The gate 222-1 is turned off as controlled by the gate drive signal 332-1 while the gate 222-4 is turned on as controlled by the gate drive signal 332-2.

Figure 4:
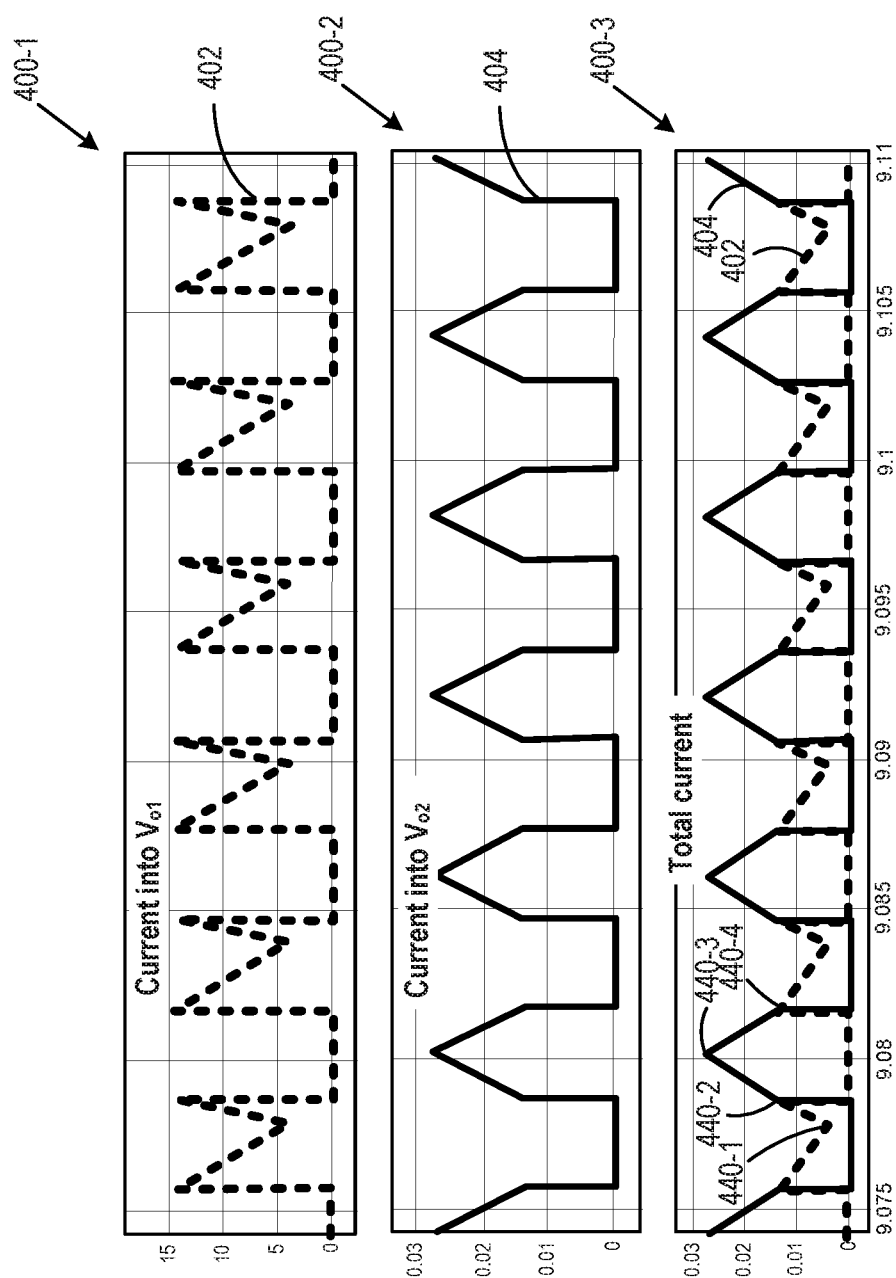
FIG. 4 is a graph illustrating a plurality of waveforms according to various embodiments.

FIG. 4 is a graph illustrating a plurality of waveforms according to various embodiments. FIG. 4 includes a graphs 400-1, 400-2, and 400-3. The graphs 400-1, 400-2, and 400-3 are given in terms of time and current. The x-axis represents time and the y-axis represents current.

The graph 400-1 shows a waveform 402 representing a current into rail 224-1 (Vo1) in FIG. 2. The graph 400-2 shows a waveform 404 representing a current into rail 224-2 (Vo2) in FIG. 2. The graph 400-3 shows the combination of the waveforms 402 and 404. The graph 400-3 shows a total current provided by the voltage regulator 205 in FIG. 2.

At operating point 440-1 of the waveforms 402 and 404, the gates 222-1 and 222-2 are turned on while the gates 222-3 and 222-4 are turned off. The inductor 206 provides a current through the rail 224-1 and not through the gate 222-2 while receiving a current from the battery 202.

At operating point 440-2 of the waveforms 402 and 404, the gates 222-1 and 222-3 are turned on while the gates 222-2 and 222-4 are turned off. The inductor 206 provides a current through the rail 224-2 and not through the gate 224-1 while receiving a current from the battery 202.

At operating point 440-3 of the waveforms 402 and 404, the gates 222-3 and 222-4 are turned on while the gates 222-1 and 222-2 are turned off. The inductor 206 continues to provide a current through the rail 224-2 and not through the gate 224-1 even though the inductor 206 is no longer receiving a current from the battery 202.

At operating point 440-4 of the waveforms 402 and 404, the gates 222-2 and 222-4 are turned on while the gates 222-1 and 222-3 are turned off. The inductor 206 provides a current through the rail 224-1 and not through the gate 224-2 even though the inductor 206 is no longer receiving a current from the battery 202.

Figure 5:
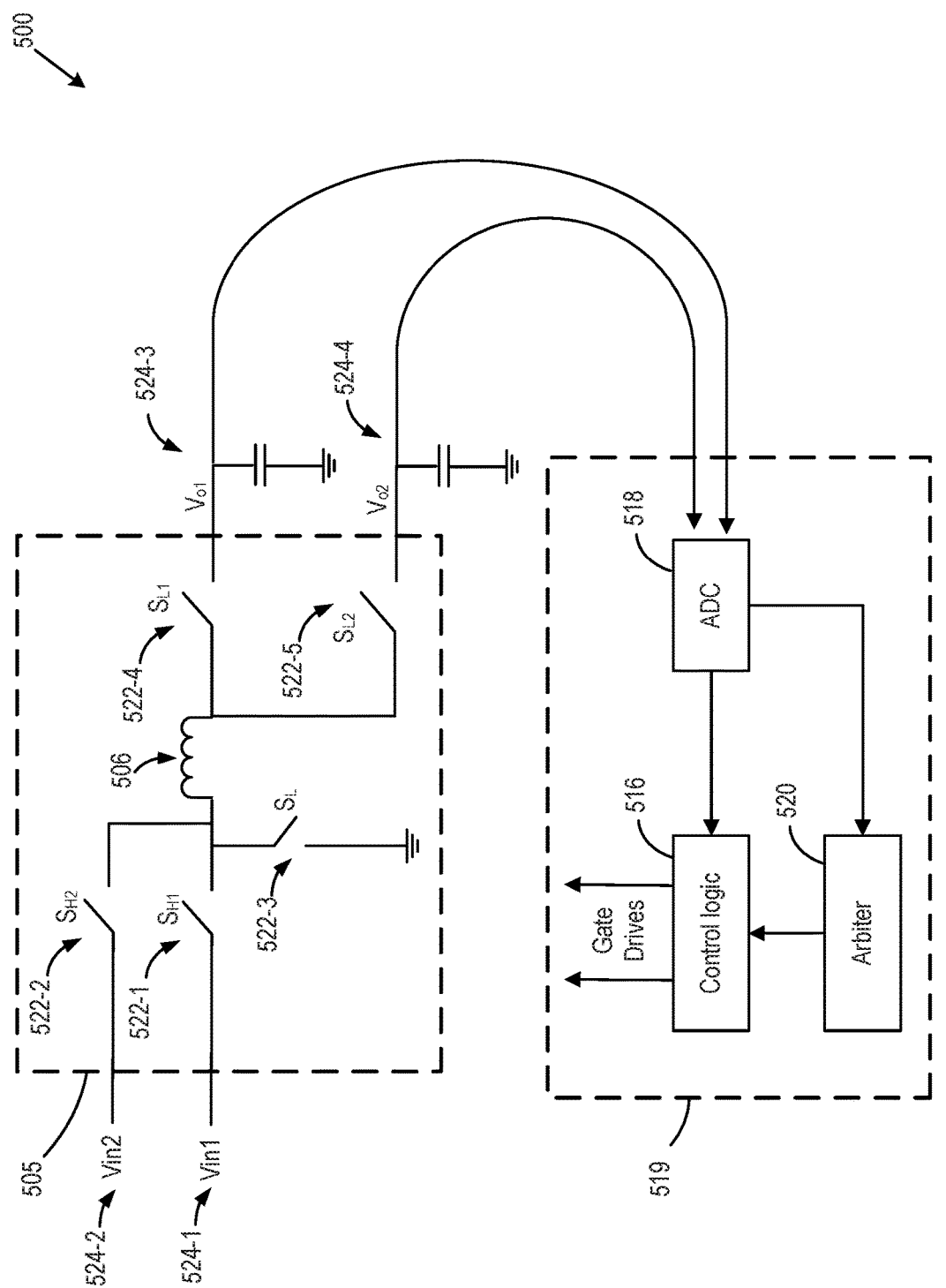
FIG. 5 is a block diagram illustrating a power system comprising a SIMO converter according to various embodiments.

FIG. 5 is a block diagram illustrating a power system 500 comprising a SIMO converter according to various embodiments. The power system 500 shows a voltage regulator 505, rails 524-1, 524-2, 524-3, and 524-4, and a master-slave controller 519.

FIG. 5 shows the master-slave controller 519 interacting with a SIMO converter. The SIMO converter is a voltage regulator 505. The voltage regulator 505 receives two inputs through the rails 524-1 and 524-2 and generates two outputs through the rails 524-3 and 524-4. Accordingly, the voltage regulator 505 receives a first input voltage through the rail 524-1 and a second input voltage through the rail 524-2. The voltage regulator 505 provides a first output voltage through the rail 524-3 and a second output voltage through the rail 524-4. The output voltages are provided using the single inductor 506, gates 522-1, 522-2, 522-3, 522-4, and 522-5, and the input voltages.

In some examples, the first input voltage is equal to the second input voltage. In other examples, the first input voltage is not equal to the second input voltage. The first input voltage and the second input voltage are provided by a power source (not shown).

The gates 522-1, 522-2, 522-3, 522-4, and 522-5 are referred to as the gates 522. The gates 522 can be divided into a first group of gates comprising the gates 522-1 522-3, and 522-4 and a second group of gates comprising the gates 522-2, 522-3, and 522-5. A first duty cycle can be applied to the first group of gates and a second duty cycle can be applied to the second group of gates to provide a voltage to the rails 524-3 and 524-4.

The first group of gates and the second group of gates are labeled as a master voltage regulator or a slave voltage regulator by the arbiter 520. If the first group of gates are labeled as a master voltage regulator, then the first duty cycle is calculated based on the first output voltage and a first input voltage and the second duty cycle is calculated based on at least the first duty cycle. If the second group of gates are labeled as a master voltage regulator, then the second duty cycle is calculated based on the second output voltage and a second input voltage and the first duty cycle is calculated based on the second duty cycle.

For example, if the first group of gates are labeled a master voltage regulator, then the first duty cycle is equal to the first output voltage divided by the first input voltage. The second duty cycle is equal to the first duty cycle multiplied by the second output voltage and divided by the first input voltage. If the second group of gates are labeled a master voltage regulator, then the second duty cycle is equal to the second output voltage divided by the second input voltage. The first duty cycle is equal to the second duty cycle multiplied by the first output voltage and divided by the second input voltage.

The master-slave controller 516 calculates the first duty cycle and the second duty cycle. The master-slave controller 516 can perform calculations utilizing the values provided by the ADC 518 and the labels provided by the arbiter 520.

Figure 6:
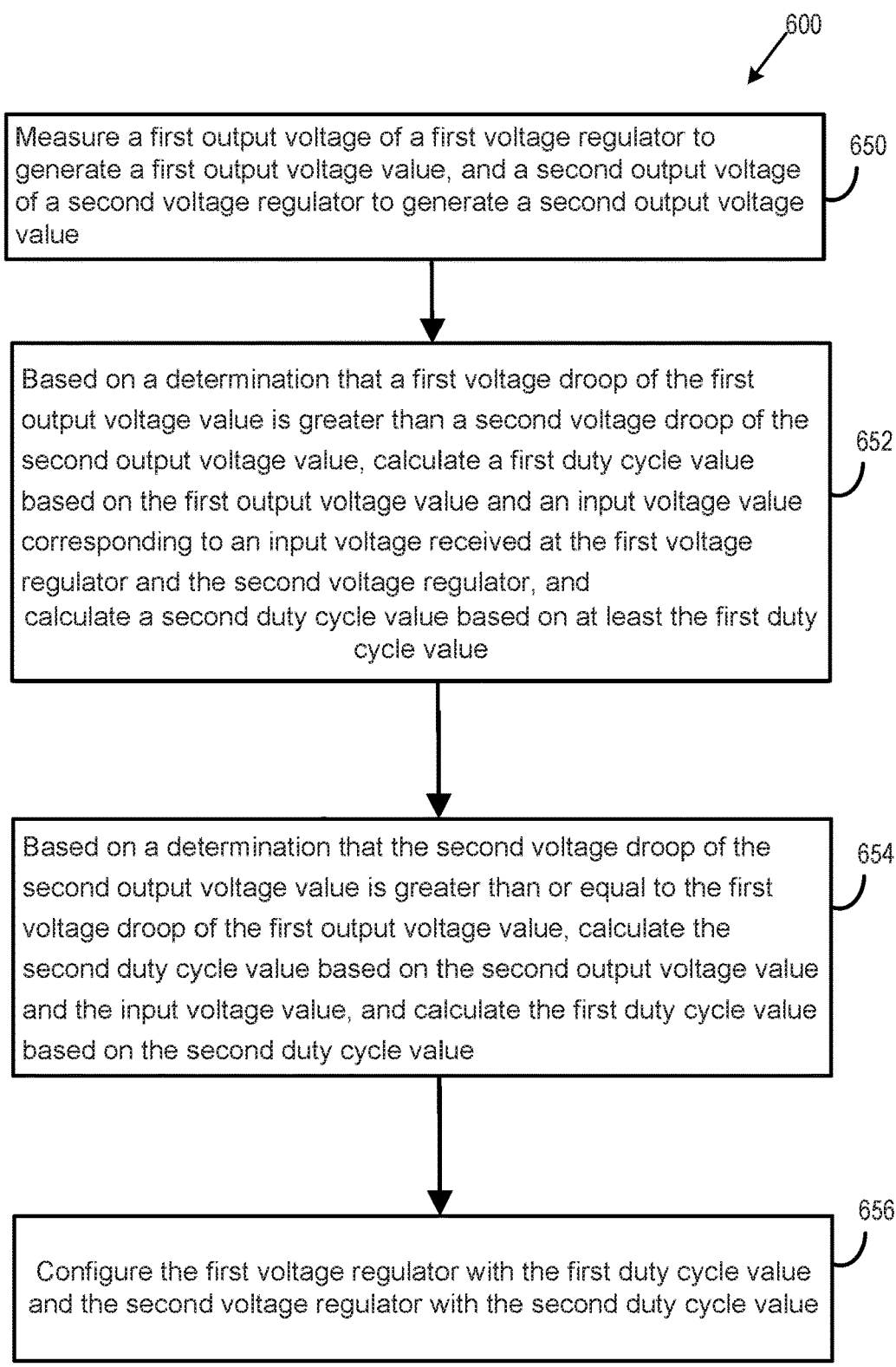
FIGS. 6, 7, and 8 are flow diagrams illustrating methods for operating a master-slave controller and a power system according to various embodiments.

FIG. 6 is a flow diagram illustrating a method 600 for operating a master-slave controller according to various embodiments. The method 600 comprises measuring 650 a first output voltage of a first voltage regulator to generate a first output voltage value, and a second output voltage of a second voltage regulator to generate a second output voltage value. The method 600 also comprises, based on a determination that a first voltage droop of the first output voltage value is greater than a second voltage droop of the second output voltage value, calculating 652 a first duty cycle value based on the first output voltage value and an input voltage value corresponding to an input voltage received at the first voltage regulator and the second voltage regulator and calculate a second duty cycle value based on the first duty cycle value. The method 600 also comprises, based on a determination that the second voltage droop of the second output voltage value is greater than or equal to the first voltage droop of the first output voltage value, calculating 654 the second duty cycle value based on the second output voltage value and the input voltage value, and calculate the first duty cycle value based on the second duty cycle value. The method 600 can further comprise configuring 656 the first voltage regulator with the first duty cycle value and the second voltage regulator with the second duty cycle value.

Measuring 650 the first output voltage and the second output voltage can further comprise receiving the first output voltage and the second output voltage in an analog format. Receiving the first output voltage and the second output voltage in the analog format further comprises providing the first output voltage and the second output voltage to an ADC to generate the first output voltage value and the second output voltage value.

Measuring 650 the first output voltage and the second output voltage can further comprise receiving the first output voltage value and the second output voltage value in a digital format. The method 600 can further comprise receiving the output voltage from one of a buck stage, a boost stage, and a buck-boost stage.

Calculating 652 the first duty cycle further comprises, based on the determination that first voltage droop of the first output voltage value is greater than the second voltage droop of the second output voltage value, dividing the first output voltage value by the input voltage value. Calculating 652 the duty cycle further comprises, based on the determination that the second voltage droop of the second output voltage value is greater than the first voltage droop of the first output voltage value, dividing the second output voltage value by the input voltage value.

Calculating 654 the second duty cycle further comprises, based on the determination that the first voltage droop of the first output voltage value is greater than the second voltage droop of the second output voltage value, performing a multiplication operation utilizing the first duty cycle value and the second output voltage value and dividing a first result of the multiplication operation by the first output voltage value. Calculating 654 the second duty cycle further comprises, based on the determination that the second voltage droop of the second output voltage value is greater than the first voltage droop of the first output voltage value, performing the multiplication operation utilizing the first duty cycle value and the first output voltage value and dividing a second result of the multiplication operation by the second output voltage value.

In some examples, the multiplication operation is an analog multiplication operation. In other examples, the multiplication operation is a digital multiplication operation. A division operation used to divide the first output voltage value by the input voltage value can be an analog division operation or a digital division operation. The input voltage is a voltage provided by a battery of the power system.

Figure 7:
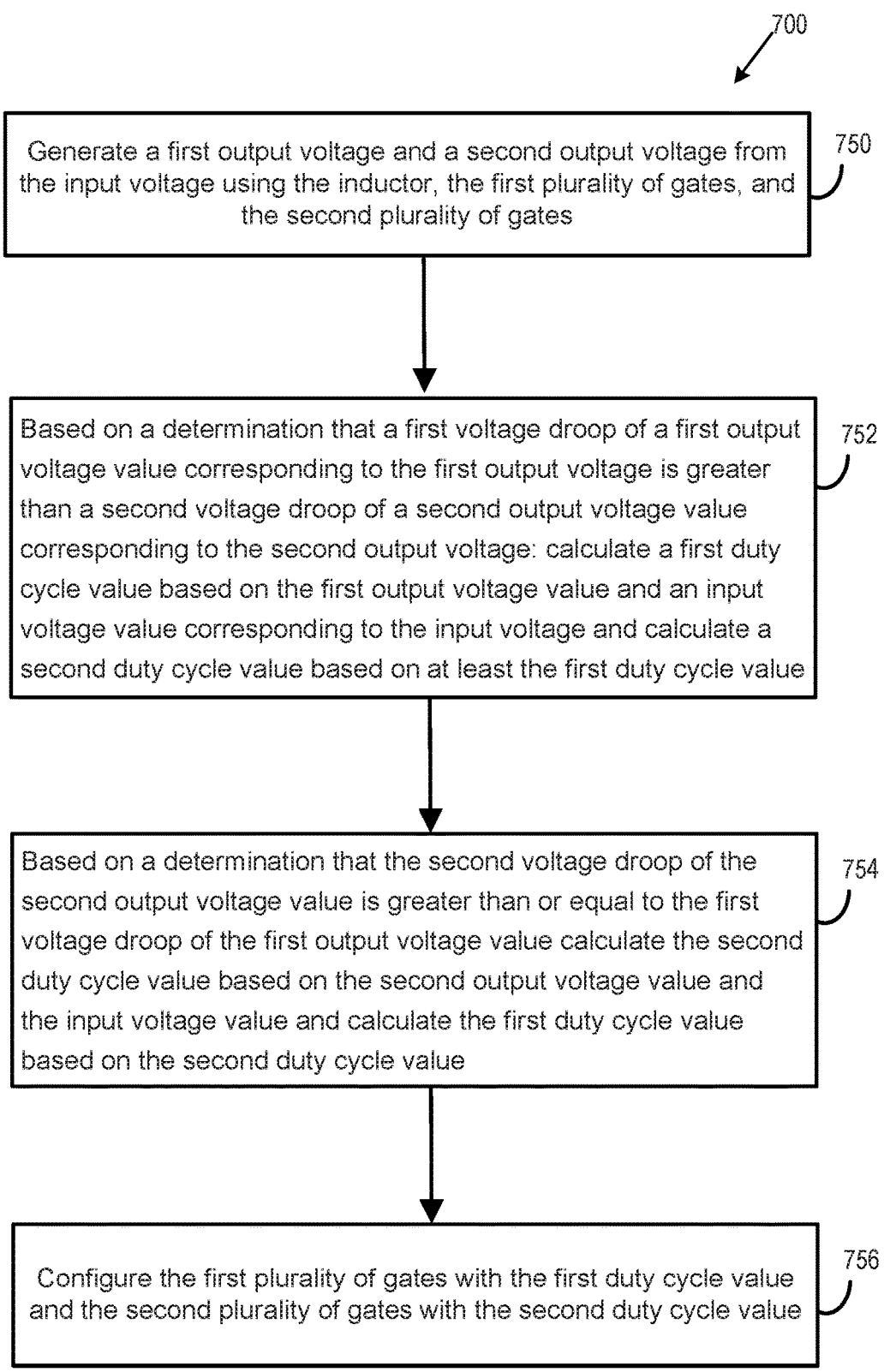

FIG. 7 is a flow diagram illustrating a method for operating a power system according to various embodiments. The method 700 comprises generating 750 a first output voltage and a second output voltage from the input voltage using the inductor, the first plurality of gates, and the second plurality of gates. The method 700 also comprises, based on a determination that a first voltage droop of a first output voltage value corresponding to the first output voltage is greater than a second voltage droop of a second output voltage value corresponding to the second output voltage, calculating 752 a first duty cycle value based on the first output voltage value and an input voltage value corresponding to the input voltage and calculating a second duty cycle value based on the first duty cycle value. The method 700 also comprises, based on a determination that the second voltage droop of the second output voltage value is greater than or equal to the first voltage droop of the first output voltage value, calculating 754 the second duty cycle value based on the second output voltage value and the input voltage value, and calculating the first duty cycle value based on the second duty cycle value. The method 700 also comprises configuring 756 the first plurality of gates with the first duty cycle value and the second plurality of gates with the second duty cycle value.

In some examples, one or more gates of the first plurality of gates are included in the second plurality of gates. In other examples, the first plurality of gates are mutually exclusive from the second plurality of gates.

The method 700 can further comprise labeling an enablement of the first plurality of gates as a master voltage regulator and the second plurality of gates as a slave voltage regulator, based on the determination that the first voltage droop of the first output voltage value is greater than the second voltage droop of the second output voltage value. The method 700 can also comprise labeling an enablement of the second plurality of gates as the master voltage regulator and the second plurality of gates as the slave voltage regulator, based on the determination that the second voltage droop of the second output voltage value is greater than the first voltage droop of the first output voltage value. The method 700 further comprises determining which of the first duty cycle value and the second duty cycle value corresponds to the master voltage regulator and calculating a different one of the first duty cycle value and the second duty cycle value based on one of the first duty cycle and the second duty cycle.

Figure 8:
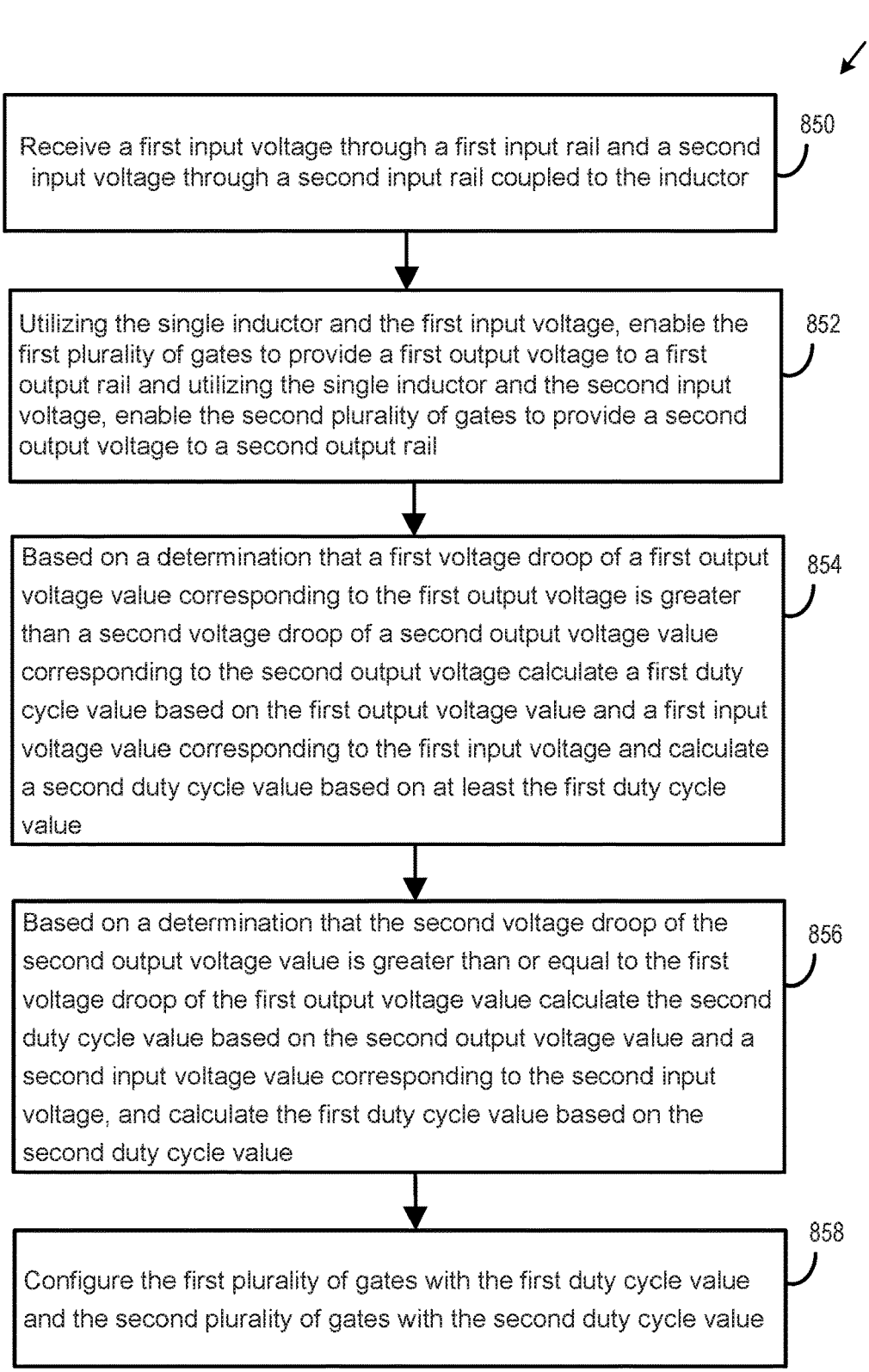
Figure 9:
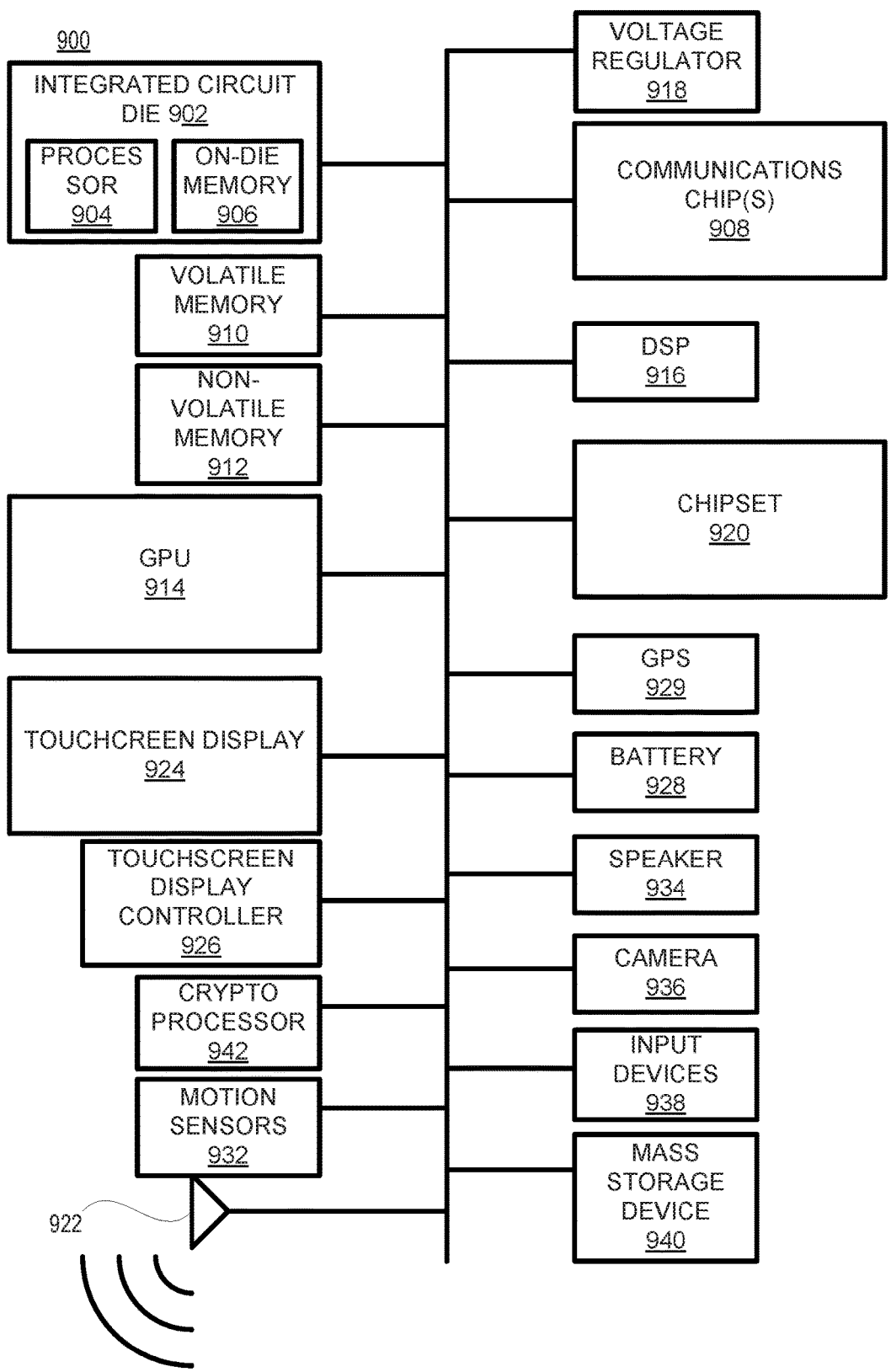
FIG. 9 is a block diagram illustrating an example computing device suitable for use to practice aspects of the present disclosure according to various embodiments.

FIG. 8 is a flow diagram illustrating a method 800 for operating a power system according to various embodiments. The method 800 comprises receiving 850 a first input voltage through a first input rail and a second input voltage through a second input rail coupled to the inductor. The method 800 also comprises, utilizing the single inductor and the first input voltage, enabling 852 the first plurality of gates to provide a first output voltage to a first output rail and, utilizing the single inductor and the second input voltage, enabling the second plurality of gates to provide a second output voltage to a second output rail.

The method 800 also comprises, based on a determination that a first voltage droop of a first output voltage value corresponding to the first output voltage is greater than a second voltage droop of a second output voltage value corresponding to the second output voltage, calculating 854 a first duty cycle value based on the first output voltage value and a first input voltage value corresponding to the first input voltage and calculating a second duty cycle value based on the first duty cycle value. The method 800 also comprises, based on a determination that the second voltage droop of the second output voltage value is greater than or equal to the first voltage droop of the first output voltage value, calculating 856 the second duty cycle value based on the second output voltage value and a second input voltage value corresponding to the second input voltage, and calculating the first duty cycle value based on the second duty cycle value. The method 800 further comprises configuring 858 the first plurality of gates with the first duty cycle value and the second plurality of gates with the second duty cycle value. The first output voltage value and the second output voltage value of the power stage are a voltage output value of the power system.

FIG. 900 illustrates a computing device 900 in accordance with one embodiment of the invention. The computing device 900 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a CPU 904 as well as on-die memory 906, often used as cache memory, that can be provided by technologies such as embedded DRAM (eDRAM), SRAM, or spin-transfer torque memory (STT-M RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (e.g., a specialized processor that executes cryptographic algorithms within hardware), a chipset 920, at least one antenna 922 (in some implementations two or more antennas may be used), a display or a touchscreen display 924, a touchscreen controller 926, a battery 928 or other power source, a power amplifier (not shown), a voltage regulator 918, a global positioning system (GPS) device 929, a compass (not shown), a motion coprocessor or sensors 932 (that may include an accelerometer, a gyroscope, and a compass), a microphone (not shown), a speaker 934, a camera 936, user input devices 938 (such as a keyboard, mouse, stylus, and touchpad), and a mass storage device 940 (such as hard disk drive, compact disk (CD), digital versatile disk (DVD), and so forth). The computing device 900 may incorporate further transmission, telecommunication, or radio functionality not already described herein. In some implementations, the computing device 900 includes a radio that is used to communicate over a distance by modulating and radiating electromagnetic waves in air or space. In further implementations, the computing device 900 includes a transmitter and a receiver (or a transceiver) that is used to communicate over a distance by modulating and radiating electromagnetic waves in air or space.

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi, NFC, and Bluetooth and a second communications logic unit 908 may be dedicated to longer range wireless communications such as GPS, EDGE, GPRS, CDMA, WiMAX, LTE, Ev-DO, and others.

The processor 904 of the computing device 900 includes one or more devices, such as transistors or metal interconnects, that are formed in accordance with embodiments of the invention. The term "processor" may refer to any device or portion of a device that processes electronic data from registers and/or memory to transform that electronic data into other electronic data that may be stored in registers and/or memory.

The communications logic unit 908 may also include one or more devices, such as transistors or metal interconnects, that are formed in accordance with embodiments of the invention.

In further embodiments, another component housed within the computing device 900 may contain one or more devices, such as transistors or metal interconnects, that are formed in accordance with implementations of the invention.

In various embodiments, the computing device 900 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The following are example embodiments that fall within the scope of the disclosure.

Example 1 is a master-slave controller comprising measurement circuitry to measure a first output voltage of a first voltage regulator to generate a first output voltage value, and a second output voltage of a second voltage regulator to generate a second output voltage value. The master-slave controller also includes control circuitry to, based on a determination that a first voltage droop of the first output voltage value is greater than a second voltage droop of the second output voltage value, calculate a first duty cycle value based on the first output voltage value and an input voltage value corresponding to an input voltage received at the first voltage regulator and the second voltage regulator, and calculate a second duty cycle value based on the first duty cycle value. The control circuitry is also to, based on a determination that the second voltage droop of the second output voltage value is greater than or equal to the first voltage droop of the first output voltage value, calculate the second duty cycle value based on the second output voltage value and the input voltage value, and calculate the first duty cycle value based on the second duty cycle value. The control circuitry is also to control the first voltage regulator with the first duty cycle value and the second voltage regulator with the second duty cycle value.

Example 2 is the master-slave controller of Example 1, wherein the measurement circuitry to measure the first output voltage and the second output voltage is further configured to receive the first output voltage and the second output voltage in an analog format.

Example 3 is the master-slave controller of Example 2, wherein the measurement circuitry is configured to receive the first output voltage and the second output voltage in the analog format is further configured to provide the first output voltage and the second output voltage to an analog to digital converter (ADC) to generate the first output voltage value and the second output voltage value.

Example 4 is the master-slave controller of Example 1, wherein the measurement circuitry to measure the first output voltage and the second output voltage is further configured to receive the first output voltage value and the second output voltage value in a digital format.

Example 5 is the master-slave controller of Example 1, wherein the measurement circuitry is further configured to receive the output voltage from one of a buck stage, a boost stage, and a buck-boost stage.

Example 6 is the master-slave controller of Example 1, wherein the control circuitry to calculate the first duty cycle value is further configured to based on the determination that the first voltage droop of the first output voltage value is greater than the second voltage droop of the second output voltage value, divide the first output voltage value by the input voltage value, and based on the determination that the second voltage droop of the second output voltage value is greater than the first voltage droop of the first output voltage value, divide the second output voltage value by the input voltage value.

Example 7 is the master-slave controller of Example 1, wherein the control circuitry to calculate the second duty cycle value is further configured to: based on the determination that the first voltage droop of the first output voltage value is greater than the second voltage droop of the second output voltage value, perform a multiplication operation utilizing the first duty cycle value and the second output voltage value and divide a first result of the multiplication operation by the first output voltage value; and based on the determination that the second voltage droop of the second output voltage value is greater than the second voltage droop of the first output voltage value, perform the multiplication operation utilizing the first duty cycle value and the first output voltage value and divide a second result of the multiplication operation by the second output voltage value.

Example 8 is the master-slave controller of Example 7, wherein the multiplication operation is an analog multiplication operation.

Example 9 is the master-slave controller of Example 7, wherein the multiplication operation is a digital multiplication operation.

Example 10 is the master-slave controller of Example 1, wherein a division operation used to divide the first output voltage value by the input voltage value is an analog division operation.

Example 11 is the master-slave controller of Example 1, wherein a division operation used to multiply the first output voltage value by the input voltage value is a digital division operation.

Example 12 is the master-slave controller of Example 1, wherein the input voltage is provided by a battery.

Example 13 is a power system, comprising: a power stage comprising a first plurality of gates, a second plurality of gates, and an inductor to: receive an input voltage; and generate a first output voltage and a second output voltage from the input voltage using the inductor, the first plurality of gates, and the second plurality of gates. The power system also includes a master-slave controller to: based on a determination that a first voltage droop of a first output voltage value corresponding to the first output voltage is greater than a second voltage droop of a second output voltage value corresponding to the second output voltage: calculate a first duty cycle value based on the first output voltage value and an input voltage value corresponding to the input voltage; and calculate a second duty cycle value based on the first duty cycle value; based on a determination that the second voltage droop of the second output voltage value is greater than or equal to the first voltage droop of the first output voltage value: calculate the second duty cycle value based on the second output voltage value and the input voltage value; and calculate the first duty cycle value based on the second duty cycle value; and configure the first plurality of gates with the first duty cycle value and the second plurality of gates with the second duty cycle value.

Example 14 is the power system of Example 13, wherein one or more gates of the first plurality of gates are included in the second plurality of gates.

Example 15 is the power system of Example 13, wherein the first plurality of gates are mutually exclusive from the second plurality of gates.

Example 16 is the power system of Example 13, further comprising an arbiter to label an enablement of the first plurality of gates as a master voltage regulator and the second plurality of gates as a slave voltage regulator, based on the determination that the first voltage droop of the first output voltage value is greater than the second voltage droop of the second output voltage value.

Example 17 is the power system of Example 16, wherein the arbiter is further to label an enablement of the second plurality of gates as the master voltage regulator and the second plurality of gates as the slave voltage regulator, based on the determination that the second voltage droop of the second output voltage value is greater than the first voltage droop of the first output voltage value.

Example 18 is the power system of Example 17, wherein the arbiter is further to determine which of the first duty cycle value and the second duty cycle value corresponds to the master voltage regulator and calculate a different one of the first duty cycle value and the second duty cycle value based on the one of the first duty cycle and the second duty cycle.

Example 19 is a power system, comprising a power stage including a first plurality of gates, a second plurality of gates, and an inductor. The power stage is to: receive a first input voltage through a first input rail and a second input voltage through a second input rail coupled to the inductor; utilizing the single inductor and the first input voltage, enable the first plurality of gates to provide a first output voltage to a first output rail; and utilizing the single inductor and the second input voltage, enable the second plurality of gates to provide a second output voltage to a second output rail. The power system also includes a master-slave controller to: based on a determination that a first voltage droop of a first output voltage value corresponding to the first output voltage is greater than a second voltage droop of a second output voltage value corresponding to the second output voltage: calculate a first duty cycle value based on the first output voltage value and a first input voltage value corresponding to the first input voltage; and calculate a second duty cycle value based on the first duty cycle value; based on a determination that the second voltage droop of the second output voltage value is greater than or equal to the first voltage droop of the first output voltage value: calculate the second duty cycle value based on the second output voltage value and a second input voltage value corresponding to the second input voltage; and calculate the first duty cycle value based on the second duty cycle value; and configure the first plurality of gates with the first duty cycle value and the second plurality of gates with the second duty cycle value.

Example 20 is the power system of Example 19, wherein the first output voltage value and the second output voltage value of the power stage are a voltage output value of the power system.

Example 21 is a method for a master-slave controller, the method comprising: measuring a first output voltage of a first voltage regulator to generate a first output voltage value, and a second output voltage of a second voltage regulator to generate a second output voltage value; based on a determination that a first voltage droop of the first output voltage value is greater than a second voltage droop of the second output voltage value: calculating a first duty cycle value based on the first output voltage value and an input voltage value corresponding to an input voltage received at the first voltage regulator and the second voltage regulator; and calculating a second duty cycle value based on the first duty cycle value; based on a determination that the second voltage droop of the second output voltage value is greater than or equal to the first voltage droop of the first output voltage value: calculating the second duty cycle value based on the second output voltage value and the input voltage value; and calculating the first duty cycle value based on the second duty cycle value; and controlling the first voltage regulator with the first duty cycle value and the second voltage regulator with the second duty cycle value.

Example 22 is the method of Example 21, further comprising receiving the first output voltage and the second output voltage in an analog format.

Example 23 is the method of Example 22, further comprising providing the first output voltage and the second output voltage to an analog to digital converter (ADC) to generate the first output voltage value and the second output voltage value.

Example 24 is the method of Example 21, further comprising receiving the first output voltage value and the second output voltage value in a digital format.

Example 25 is the method of Example 21, further comprising receiving the output voltage from one of a buck stage, a boost stage, and a buck-boost stage.

Example 26 is the method of Example 21, further comprising: based on the determination that the first voltage droop of the first output voltage value is greater than the second voltage droop of the second output voltage value, dividing the first output voltage value by the input voltage value; and based on the determination that the second voltage droop of the second output voltage value is greater than the first voltage droop of the first output voltage value, dividing the second output voltage value by the input voltage value.

Example 27 is the method of Example 21, further comprising: based on the determination that the first voltage droop of the first output voltage value is greater than the second voltage droop of the second output voltage value, performing a multiplication operation utilizing the first duty cycle value and the second output voltage value and dividing a first result of the multiplication operation by the first output voltage value; and based on the determination that the second voltage droop of the second output voltage value is greater than the second voltage droop of the first output voltage value, performing the multiplication operation utilizing the first duty cycle value and the first output voltage value and dividing a second result of the multiplication operation by the second output voltage value.

Example 28 is the method of Example 27, wherein the multiplication operation is an analog multiplication operation.

Example 29 is the method of Example 27, wherein the multiplication operation is a digital multiplication operation.

Example 30 is the method of Example 21, wherein a division operation used to divide the first output voltage value by the input voltage value is an analog division operation.

Example 31 is the method of Example 21, wherein a division operation used to multiply the first output voltage value by the input voltage value is a digital division operation.

Example 32 is the method of Example 21, wherein the input voltage is provided by a battery.

Example 33 is a method for a power system, comprising: receiving, at a power stage, an input voltage; generating, at the power stage, a first output voltage and a second output voltage from the input voltage using an inductor, a first plurality of gates, and a second plurality of gates; based on a determination, at a master-slave controller, that a first voltage droop of a first output voltage value corresponding to the first output voltage is greater than a second voltage droop of a second output voltage value corresponding to the second output voltage: calculating a first duty cycle value based on the first output voltage value and an input voltage value corresponding to the input voltage; and calculating a second duty cycle value based on the first duty cycle value; based on a determination, at the master-slave controller, that the second voltage droop of the second output voltage value is greater than or equal to the first voltage droop of the first output voltage value: calculating the second duty cycle value based on the second output voltage value and the input voltage value; and calculating the first duty cycle value based on the second duty cycle value; and configuring the first plurality of gates with the first duty cycle value and the second plurality of gates with the second duty cycle value.

Example 34 is the method of Example 33, further comprising labelling, at an arbiter, an enablement of the first plurality of gates as a master voltage regulator and the second plurality of gates as a slave voltage regulator, based on the determination that the first voltage droop of the first output voltage value is greater than the second voltage droop of the second output voltage value.

Example 35 is the method of Example 34, further comprising labelling, at the arbiter, an enablement of the second plurality of gates as the master voltage regulator and the second plurality of gates as the slave voltage regulator, based on the determination that the second voltage droop of the second output voltage value is greater than the first voltage droop of the first output voltage value.

Example 36 is the method of Example 35, further comprising determining, at the arbiter, which of the first duty cycle value and the second duty cycle value corresponds to the master voltage regulator and calculating a different one of the first duty cycle value and the second duty cycle value based on the one of the first duty cycle and the second duty cycle.

Example 37 is a method, comprising: receiving a first input voltage through a first input rail and a second input voltage through a second input rail coupled to an inductor; utilizing the single inductor and the first input voltage, enabling the first plurality of gates to provide a first output voltage to a first output rail; utilizing the single inductor and the second input voltage, enabling the second plurality of gates to provide a second output voltage to a second output rail; based on a determination that a first voltage droop of a first output voltage value corresponding to the first output voltage is greater than a second voltage droop of a second output voltage value corresponding to the second output voltage: calculating a first duty cycle value based on the first output voltage value and a first input voltage value corresponding to the first input voltage; and calculating a second duty cycle value based on the first duty cycle value; based on a determination that the second voltage droop of the second output voltage value is greater than or equal to the first voltage droop of the first output voltage value: calculating the second duty cycle value based on the second output voltage value and a second input voltage value corresponding to the second input voltage; and calculating the first duty cycle value based on the second duty cycle value; and controlling the first plurality of gates with the first duty cycle value and the second plurality of gates with the second duty cycle value.

Example 38 is at least one computer-readable storage medium having stored thereon computer-readable instructions, when executed, to implement a method as recited in any of Examples 21-37.

Example 39 is an apparatus comprising means to perform a method as recited in any of Examples 21-37.

Example 40 is a means for performing a method as recited in any of Examples 21-37.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

The terminology used herein is for the purpose of describing particular embodiments only and is not intended to be limiting of the disclosure. As used herein, the singular forms "a," "an," and "the" are intended to include plural forms as well, unless the context clearly indicates otherwise. It will be further understood that the terms "comprises" and/or "comprising," when used in this specification, are specific to the presence of stated features, integers, steps, operations, elements, and/or components, but do not preclude the presence or addition of one or more other features, integers, steps, operation, elements, components, and/or groups thereof.

Embodiments may be implemented as a computer process, a computing system, or an article of manufacture such as a computer program product of computer-readable media. The computer program product may be a computer storage medium readable by a computer system and encoding computer program instructions for executing a computer process.

The corresponding structures, materials, acts, and equivalents of all means or steps plus function elements in the claims below are intended to include any structure, material, or act for performing the function in combination with other claimed elements that are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment was chosen and described in order to best explain the principles of the disclosure and the practical application, and to enable others of ordinary skill in the art to understand the disclosure for embodiments with various modifications as are suited to the particular use contemplated.

It will be understood by those having skill in the art that many changes may be made to the details of the above-described embodiments without departing from the underlying principles of the invention. The scope of the present invention should, therefore, be determined only by the following claims.

The invention claimed is:

1. A master-slave controller, comprising:
   measurement circuitry to measure a first output voltage of a first voltage regulator to generate a first output voltage value, and a second output voltage of a second voltage regulator to generate a second output voltage value; and
   control circuitry to:
      based on a determination that a first voltage droop of the first output voltage value is greater than a second voltage droop of the second output voltage value:
         calculate a first duty cycle value based on the first output voltage value and an input voltage value corresponding to an input voltage received at the first voltage regulator and the second voltage regulator; and
         calculate a second duty cycle value as the first duty cycle value multiplied by the second output voltage value and divided by the first output voltage value;
      based on a determination that the second voltage droop of the second output voltage value is greater than or equal to the first voltage droop of the first output voltage value:
         calculate the second duty cycle value based on the second output voltage value and the input voltage value; and
         calculate the first duty cycle value based on the second duty cycle value multiplied by the first output voltage value and divided by the second output voltage value; and
      control the first voltage regulator with the calculated first duty cycle value and the second voltage regulator with the calculated second duty cycle value.

2. The master-slave controller of claim 1, wherein the measurement circuitry to measure the first output voltage and the second output voltage is further configured to receive the first output voltage and the second output voltage in an analog format.

3. The master-slave controller of claim 2, wherein the measurement circuitry is configured to receive the first output voltage and the second output voltage in the analog format is further configured to provide the first output voltage and the second output voltage to an analog to digital converter (ADC) to generate the first output voltage value and the second output voltage value.

4. The master-slave controller of claim 1, wherein the measurement circuitry to measure the first output voltage and the second output voltage is further configured to receive the first output voltage value and the second output voltage value in a digital format.

5. The master-slave controller of claim 1, wherein the measurement circuitry is further configured to receive the output voltage from one of a buck stage, a boost stage, and a buck-boost stage.

6. The master-slave controller of claim 1, wherein the control circuitry to calculate the first duty cycle value is further configured to:
   based on the determination that the first voltage droop of the first output voltage value is greater than the second voltage droop of the second output voltage value, divide the first output voltage value by the input voltage value; and
   based on the determination that the second voltage droop of the second output voltage value is greater than the first voltage droop of the first output voltage value, divide the second output voltage value by the input voltage value.

7. The master-slave controller of claim 1, wherein the control circuitry to calculate the second duty cycle value is further configured to:
   based on the determination that the first voltage droop of the first output voltage value is greater than the second voltage droop of the second output voltage value, perform a multiplication operation utilizing the first duty cycle value and the second output voltage value and divide a first result of the multiplication operation by the first output voltage value; and
   based on the determination that the second voltage droop of the second output voltage value is greater than the second voltage droop of the first output voltage value, perform the multiplication operation utilizing the first duty cycle value and the first output voltage value and divide a second result of the multiplication operation by the second output voltage value.

8. The master-slave controller of claim 7, wherein the multiplication operation is an analog multiplication operation.

9. The master-slave controller of claim 7, wherein the multiplication operation is a digital multiplication operation.

10. The master-slave controller of claim 1, wherein a division operation used to divide the first output voltage value by the input voltage value is an analog division operation.

11. The master-slave controller of claim 1, wherein a division operation used to multiply the first output voltage value by the input voltage value is a digital division operation.

12. The master-slave controller of claim 1, wherein the input voltage is provided by a battery.

13. A power system, comprising:
   a power stage comprising a plurality of gates and an inductor to:
      receive an input voltage; and
      generate a first output voltage and a second output voltage from the input voltage using the inductor, a first subset of the plurality of gates, and a second subset of the plurality of gates; and
   a master-slave controller to:
      based on a determination that a first voltage droop of a first output voltage value corresponding to the first output voltage is greater than a second voltage droop of a second output voltage value corresponding to the second output voltage:
    calculate a first duty cycle value based on the first output voltage value and an input voltage value corresponding to the input voltage; and
    calculate a second duty cycle value proportional to the first duty cycle value;
based on a determination that the second voltage droop of the second output voltage value is greater than or equal to the first voltage droop of the first output voltage value:
    calculate the second duty cycle value based on the second output voltage value and the input voltage value; and
    calculate the first duty cycle value proportional to the second duty cycle value; and
control the first subset of the plurality of gates with the calculated first duty cycle value and the second subset of the plurality of gates with the calculated second duty cycle value.

14. The power system of claim 13, wherein one or more gates of the first subset of the plurality of gates are included in the second subset of the plurality of gates.

15. The power system of claim 13, wherein the first subset of the plurality of gates is mutually exclusive from the second subset of the plurality of gates.

16. The power system of claim 13, further comprising an arbiter to:
    label an enablement of the first subset of the plurality of gates as a master voltage regulator and the second subset of the plurality of gates as a slave voltage regulator, based on the determination that the first voltage droop of the first output voltage value is greater than the second voltage droop of the second output voltage value.

17. The power system of claim 16, wherein the arbiter is further to:
    label an enablement of the second subset of the plurality of gates as the master voltage regulator and the first subset of the plurality of gates as the slave voltage regulator, based on the determination that the second voltage droop of the second output voltage value is greater than the first voltage droop of the first output voltage value.

18. The power system of claim 17, wherein the arbiter is further to determine which of the first duty cycle value and the second duty cycle value corresponds to the master voltage regulator and calculate a different one of the first duty cycle value and the second duty cycle value based on the one of the first duty cycle and the second duty cycle.

19. A power system, comprising:
a power stage comprising a first plurality of gates, a second plurality of gates, and a single inductor to:
    receive a first input voltage through a first input rail and a second input voltage through a second input rail coupled to the inductor;
    utilizing the single inductor and the first input voltage, enable the first plurality of gates to provide a first output voltage to a first output rail; and
    utilizing the single inductor and the second input voltage, enable the second plurality of gates to provide a second output voltage to a second output rail; and
a master-slave controller to:
    based on a determination that a first voltage droop of a first output voltage value corresponding to the first output voltage is greater than a second voltage droop of a second output voltage value corresponding to the second output voltage:
        calculate a first duty cycle value based on the first output voltage value and a first input voltage value corresponding to the first input voltage; and
        calculate a second duty cycle value proportional to the first duty cycle value;
    based on a determination that the second voltage droop of the second output voltage value is greater than or equal to the first voltage droop of the first output voltage value:
        calculate the second duty cycle value based on the second output voltage value and a second input voltage value corresponding to the second input voltage; and
        calculate the first duty cycle value proportional to the second duty cycle value; and
    control the first plurality of gates with the calculated first duty cycle value and the second plurality of gates with the calculated second duty cycle value.

20. The power system of claim 19, wherein the first output voltage value and the second output voltage value of the power stage are a voltage output value of the power system.

* * * * *